(12) United States Patent
Fang et al.

(10) Patent No.: US 7,750,618 B1
(45) Date of Patent: Jul. 6, 2010

(54) SYSTEM AND METHOD FOR TESTING A CLOCK CIRCUIT

(75) Inventors: Al Xuefeng Fang, Suwanee, GA (US); Chao Xu, Suwanee, GA (US)

(73) Assignee: Integrated Device Technology, Inc., San Jose, CA (US)

( * ) Notice: Subject to any disclaimer, the term of this patent is extended or adjusted under 35 U.S.C. 154(b) by 233 days.

(21) Appl. No.: 11/459,889

(22) Filed: Jul. 25, 2006

(51) Int. Cl.
*G01R 23/14* (2006.01)
(52) U.S. Cl. .............................. 324/76.41; 324/76.48
(58) Field of Classification Search .............. 324/76.41, 324/76.48, 76.79
See application file for complete search history.

(56) References Cited

U.S. PATENT DOCUMENTS

| | | | |
|---|---|---|---|
| 5,729,151 A | 3/1998 | Zoerner | |
| 6,320,469 B1 | 11/2001 | Friedberg | |
| 6,486,651 B1 * | 11/2002 | Lee et al. .................. | 324/76.53 |
| 6,774,687 B2 * | 8/2004 | Gomm et al. ................ | 327/158 |
| 6,781,861 B2 * | 8/2004 | Gomm et al. ................ | 365/144 |
| 6,809,974 B2 * | 10/2004 | Jones et al. .................. | 365/201 |
| 7,068,085 B2 * | 6/2006 | Gomm et al. ................ | 327/158 |
| 7,075,285 B2 * | 7/2006 | Chin ......................... | 324/76.54 |
| 7,274,200 B2 * | 9/2007 | Miyake et al. ............... | 324/763 |
| 7,454,306 B2 * | 11/2008 | Hein .......................... | 702/125 |
| 7,482,827 B2 * | 1/2009 | De Cuyper et al. .......... | 324/763 |

OTHER PUBLICATIONS

Turner, Rufus, et al., The Illustrated Dictionary of Electronics, Fourth Edition, TAB Professional and Reference Books, Inc., 1988, p. 552.*

* cited by examiner

*Primary Examiner*—Thomas Valone
(74) *Attorney, Agent, or Firm*—Stanley J. Pawlik; Kenneth Glass; Glass & Associates

(57) ABSTRACT

A test circuit determines whether a frequency of an output clock signal of a clock circuit is above an output threshold frequency. An input clock signal of the clock circuit is set to an elevated frequency that is higher than a specified frequency. A first counter counts the number of clock cycles of the input clock signal in a test interval to within a tolerance of the elevated frequency. The tolerance of the elevated frequency is higher than a tolerance of the specified frequency. A second counter counts the number of clock cycles of a feedback clock signal in the test interval. A comparator determines whether the frequency of the output clock signal is above the output threshold frequency based on the number of clock cycles of the input clock signal and the number of clock cycles of the feedback clock signal.

19 Claims, 4 Drawing Sheets

SYSTEM AND METHOD FOR TESTING A CLOCK CIRCUIT

BACKGROUND

1. Field of the Invention

The present invention generally relates to testing integrated circuits, and more particularly to testing clock circuits implemented in integrated circuits.

2. Description of Related Art

During manufacturing of an integrated circuit, various tests are performed to determine whether various circuits in the integrated circuit conform to desired specifications. Some of these circuits are clock circuits that generate an output clock signal based on an input clock signal and a feedback clock signal. The feedback clock signal is derived from the output clock signal and is used to generate the output clock signal at a desired frequency. One type of clock circuit that generates an output clock signal based on an input clock signal and a feedback clock signal is a phase-locked loop circuit. A phase-locked loop circuit locks a frequency and phase of a feedback clock signal to a frequency of an input clock signal. Another type of clock circuit that generates an output clock signal based on an input clock signal and a feedback clock signal is a delay-locked loop circuit. A delay-locked loop circuit locks a frequency of a feedback clock signal to a frequency of an input clock signal. Additionally, the delay-locked loop circuit delays the input clock signal by one or more clock periods to generate the output clock signal.

In many cases, an integrated circuit tester does not operate at the frequency of an output clock signal of the clock circuit. To determine whether the frequency of the feedback clock signal is locked to the frequency of the input clock signal, various techniques employ test circuitry in the integrated circuit. The test circuitry performs a test on the clock circuit to determine whether the frequency of the feedback clock signal is locked to the frequency of the input clock signal of the clock circuit. An integrated circuit tester can then determine whether the frequency of the feedback clock signal is locked to the frequency of the input clock signal based on a result of the test performed by the test circuitry. Moreover, if the frequency of the feedback clock signal is determined to be locked to the frequency of the input clock signal, the frequency of the output clock signal may be determined to be within a specified frequency range.

One technique that uses test circuitry for determining whether the frequency of a feedback clock signal of a clock circuit is locked to an input clock signal of the clock circuit employs two counters. One counter counts the number of clock cycles of the input clock signal during a test interval and the other counter counts the number of clock cycles of the feedback clock signal during the test interval. A tester then determines whether the frequency of the output clock signal is locked to the frequency of the input clock signal based on the values of the counters. Because it is difficult to start the counters at precisely the same time, the frequency of the feedback clock signal is determined to be locked to the frequency of the input clock signal if the frequency of the feedback clock signal is within a tolerance of the frequency of the input clock signal.

Typically, the frequency of the feedback clock signal is determined to be locked to the frequency of the input clock signal if the number of clock cycles of the feedback clock signal and the number of clock signals of the input clock signal in a test interval do not differ by more than one. In this case, the tolerance of the frequency of the input clock signal is the reciprocal of the number of clock cycles of the input clock signal in the test interval. Generally, the tolerance may be decreased by increasing the test interval, which increases the number of clock cycles of the input clock signal in the test interval. Increasing the test interval, however, consumes valuable test time in testing the integrated circuit. Moreover, it may be desirable in some circumstances to determine whether the frequency of the output clock signal is above a threshold frequency of a frequency range regardless of whether the frequency of the feedback clock signal is locked to the frequency of the input clock signal.

In light of the above, a need exists for reducing the time required for determining whether the frequency of a feedback clock signal of a clock circuit is locked to the frequency of an input clock signal of the clock circuit. A further need exists for reducing the time required for determining whether a frequency of an output clock signal of a clock circuit is above a threshold frequency.

SUMMARY

In various embodiments, a system determines whether a frequency of an output clock signal of a clock circuit is above an output threshold frequency. A specified frequency of an input clock signal of the clock circuit and a tolerance of the specified frequency define an input threshold frequency of the input clock signal and the output threshold frequency. An elevated frequency is selected based on the specified frequency and a tolerance of the elevated frequency is selected based on the tolerance of the specified frequency. The elevated frequency is higher than the specified frequency, and the tolerance of the elevated frequency is higher than the tolerance of the specified frequency. The input clock signal is set to the elevated frequency. A first counter counts the number of clock cycles of the input clock signal in a test interval to within the tolerance of the elevated frequency. A second counter counts the number of clock cycles of a feedback clock of the clock circuit in the test interval. A comparator compares the number of clock cycles counted by the first counter with the number of clock cycles counted by the second counter to determine whether the frequency of the feedback clock signal is above the input threshold frequency. If the frequency of the feedback clock signal is above the input threshold frequency, the frequency of the output clock signal is determined to be above the output threshold frequency. In this way, the comparator also determines whether the frequency of the output clock signal is above the output threshold frequency.

Because the tolerance of the elevated frequency is higher than the tolerance of the specified frequency, the first counter and the second counter each require fewer bits than a counter that counts clock cycles within the tolerance of the specified frequency. Moreover, the test interval for counting clock cycles within the tolerance of the elevated frequency is shorter than a test interval for counting clock cycles within the tolerance of the specified frequency, which reduces test time for testing the clock circuit.

In a further embodiment, determining whether the frequency of the input clock signal is above the input threshold frequency is performed to determine whether the frequency of the feedback clock signal is locked to the frequency of the input clock signal. If the frequency of the feedback clock signal is not above the input threshold frequency, the frequency of the feedback clock signal is determined not to be locked to the frequency of the input clock signal. In this way, test time for determining whether the frequency of the feedback clock signal is locked to the frequency of the input clock signal is reduced.

A method of testing a clock circuit, in accordance with one embodiment, includes identifying a first frequency and a first tolerance. The first frequency and the first tolerance define a first threshold frequency and an output threshold frequency. The method also includes selecting a second frequency that is higher than the first frequency. Additionally, the method includes selecting a second tolerance that is higher than the first tolerance. The second tolerance defines a second threshold frequency that is equal to or higher than the first threshold frequency. The method further includes setting an input clock signal of the clock circuit to the second frequency, determining a number of clock cycles of the input clock signal in an interval to within the second tolerance of the second frequency, and determining a number of clock cycles of a feedback clock signal of the clock circuit in the interval. Additionally, the method includes determining whether a frequency of an output clock signal of the clock circuit is above the output threshold frequency based the number of clock cycles of the input clock signal and the number of clock cycles of the feedback clock signal.

A system for testing a clock circuit, in accordance with one embodiment, includes a first counter, a second counter, and a comparator. The comparator is coupled to the first counter and the second counter. The first counter counts a number of clock cycles of an input clock signal of the clock circuit in an interval to within a second tolerance of a second frequency of the input clock signal. The second frequency is above a first frequency, and the second tolerance is above a first tolerance. Further, the first frequency and the first tolerance define an output threshold frequency. The second counter counts a number of clock cycles of a feedback clock signal of the clock circuit in the interval. The comparator determines whether a frequency of an output clock signal of the clock circuit is above the output threshold frequency based on the number of clock cycles of the input clock signal and the number of clock cycles of the feedback clock signal.

A system for testing a clock circuit, in accordance with one embodiment, includes a means for counting a number of clock cycles of an input clock signal of the clock circuit in an interval to within a second tolerance of a second frequency of the input clock signal. The second frequency is above a first frequency, and the second tolerance is above a first tolerance of the first frequency. Further, the first frequency and the first tolerance define an output threshold frequency. The system also includes a means for counting a number of clock cycles of a feedback clock signal of the clock circuit in the interval. The system further includes a means for determining whether a frequency of an output clock signal of the clock circuit is above an output threshold frequency based on the number of clock cycles of the input clock signal and the number of clock cycles of the feedback clock signal.

BRIEF DESCRIPTION OF THE DRAWINGS

The accompanying drawings are included to provide a further understanding of the invention, and are incorporated in and constitute a part of this specification. The drawings illustrate embodiments of the invention, and together with the description, serve to explain the principles of the invention. In the drawings.

DETAILED DESCRIPTION

In various embodiments, an input clock signal to a clock circuit is set to an elevated frequency, which is higher than a specified frequency of the input clock signal. A number of clock cycles of the input clock signal in a test interval are counted to within a tolerance of the elevated frequency. The tolerance of the elevated frequency is higher than a tolerance of the specified frequency. Further, a number of clock cycles of a feedback clock signal of the clock circuit are counted in the test interval. The number of clock cycles of the input clock signal and the feedback clock signal are compared to determine whether a frequency of the output clock signal is above an output threshold frequency. Because the tolerance of the elevated frequency is higher than the tolerance of the specified frequency, the test interval needed for counting the number of clock cycles to within the tolerance of the elevated frequency is less than a test interval needed for counting the number of clock cycles to within the tolerance of the specified frequency. In this way, the test interval for determining whether the frequency of the output clock signal is above the output threshold frequency is reduced.

Figure 1:
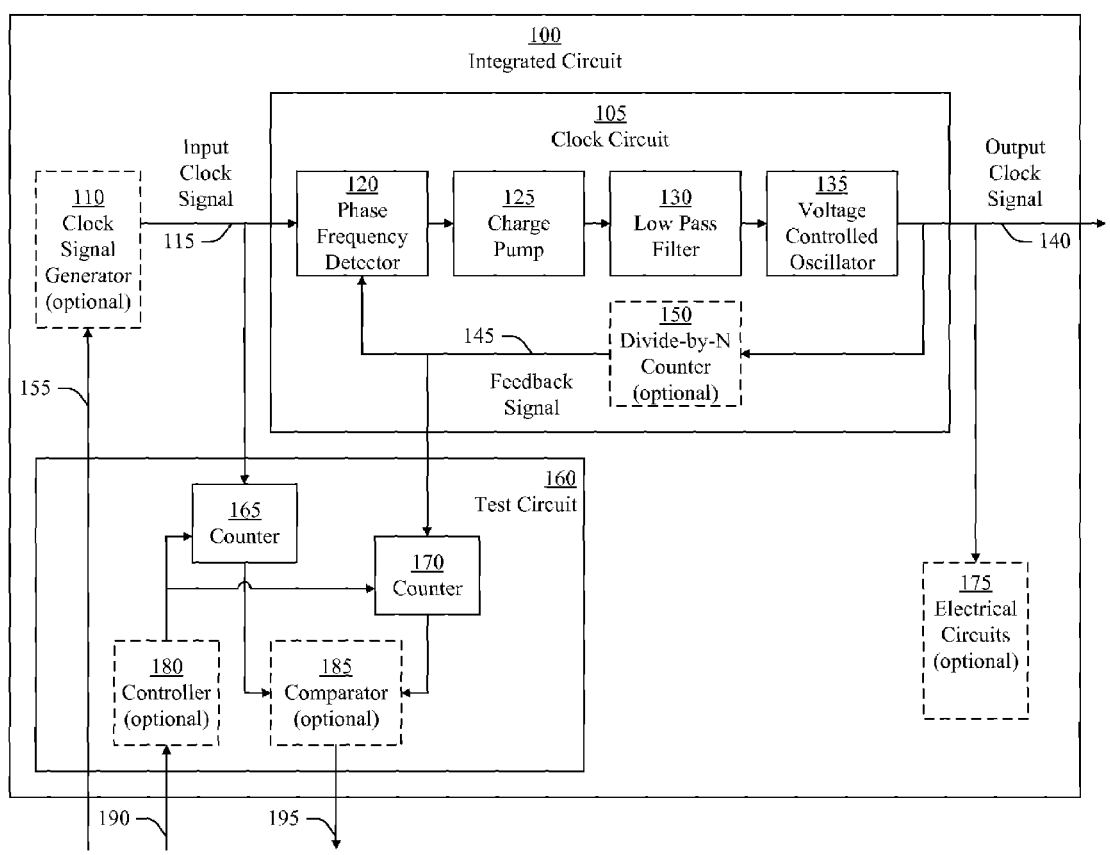
FIG. 1 is a block diagram of an integrated circuit, in accordance with an embodiment of the present invention.

FIG. 1 illustrates an integrated circuit 100, in accordance with an embodiment of the present invention. The integrated circuit 100 includes a clock circuit 105 and a test circuit 160 coupled to the clock circuit 105. The clock circuit 105 receives an input clock signal 115 and generates an output clock signal 140 and a feedback clock signal 145. The clock circuit 105 generates the output clock signal 140 based on the input clock signal 115 and the feedback clock signal 145. For example, the clock circuit 105 may include a phase-locked loop (PLL) or a delay-locked loop (DLL). The test circuit 160 determines whether the frequency of the output clock signal 140 is above an output threshold frequency based on the input clock signal 115 and the feedback clock signal 145, as is described more fully herein. Although the clock circuit 105 and the test circuit 160 are shown in the integrated circuit 100 in the embodiment of FIG. 1, the clock circuit 105 or the test circuit 160, or both, need not be contained in an integrated circuit in other embodiments.

As illustrated in FIG. 1, the clock circuit 105 includes a phase frequency detector 120, a charge pump 125, a low pass filter 130, a voltage-controlled oscillator 135, and an optional divide-by-N counter 150. The charge pump 125 is coupled to the phase frequency detector 120 and the low pass filter 130. The voltage-controlled oscillator 135 is coupled to the low pass filter 130 and the divide-by-N counter 150. Additionally, the divide-by-N counter 150 is coupled to the phase frequency detector 120.

The phase frequency detector 120 generates a signal indicating a phase difference between the input clock signal 115 and the feedback clock signal 145, and provides the signal to the charge pump 125. In turn, the charge pump 125 generates a voltage signal indicating the phase difference between the input clock signal 115 and the feedback clock signal 145. The low pass filter 130 filters out higher frequency components of the voltage signal generated by the charge pump 125 and passes lower frequency components of the voltage signal to the voltage-controlled oscillator 135. The voltage-controlled oscillator 135 generates the output clock signal 140. Moreover, the voltage-controlled oscillator 135 determines the frequency of the output clock signal 140 based on the voltage signal received from the low pass filter 130.

In operation, the clock circuit 105 locks the phase and frequency of the feedback clock signal 145 to the phase and frequency of the input clock signal 115. In embodiments without the divide-by-N counter 150, the feedback clock signal 145 is the output clock signal 140. In these embodiments, the clock circuit 105 locks the frequency of the output clock signal 140 to the frequency of the input clock signal 115.

In embodiments including the divide-by-N counter 150, the divide-by-N counter 150 divides the frequency of the output clock signal 140 by an integer N to generate the feedback clock signal 145. Because the frequency of the output clock signal 140 is an integer multiple N of the frequency of the feedback clock signal 145, the clock circuit 105 locks the frequency of the output clock signal 140 to a frequency that is an integer multiple N of the frequency of the input clock signal 115.

In another embodiment, the clock circuit 105 is a delay-locked loop. In this embodiment, the clock circuit 105 includes a voltage controlled delay line (VCDL) instead of the voltage-controlled oscillator 135. The voltage controlled delay line delays the input clock signal 115 based on the voltage signal received from the low pass filter 130 to generate the output clock signal 140. In one embodiment, the feedback clock signal 145 is the output clock signal 140, and the clock circuit 105 locks the frequency of the output clock signal 140 to the frequency of the input clock signal 115.

The integrated circuit 100 may include an optional clock signal generator 110 coupled to the clock circuit 105 for generating the input clock signal 115. In embodiments including the clock signal generator 110, the clock signal generator 110 receives a control signal 155 for selecting the frequency of the input clock signal 115. For example, an integrated circuit tester external of the integrated circuit 100 may provide the control signal 155 to the clock signal generator 110. Alternatively, the input clock signal 115 may be an input to the integrated circuit 100. For example, a tester or a clock circuit external of the integrated circuit 100 may generate the input clock signal 115.

The integrated circuit 100 may include optional electrical circuits 175. In embodiments including the electrical circuits 175, the clock circuit 105 provides the output clock signal 140 to the electrical circuits 175. The electrical circuits 175 may include any type of digital or analog circuits, such as logic gates, memories, microprocessors, embedded processors, electrical components, or the like. For example, the electrical circuits 175 may include a serializer-deserializer (SERDES) circuit.

The test circuit 160 includes a counter 165 and a counter 170. The counter 165 counts a number of clock cycles of the input clock signal 115 in a test interval. The counter 170 counts a number of clock cycles of the feedback clock signal 145 in the test interval. The test circuit 160 may further include an optional comparator 185 coupled to each of the counters 165 and 170. The comparator 185 compares the number of clock cycles of the input clock signal 115 counted by the counter 165 in the test interval to the number of clock cycles of the feedback clock signal 145 counted by the counter 170 in the test interval. Further, the comparator 185 determines based on a result of the comparison whether the frequency of the output clock signal 140 is above an output threshold frequency. In one embodiment, the comparator 185 outputs an output signal 195 indicating whether the frequency of the output clock signal 140 is above the output threshold frequency. For example, the comparator 185 can provide the output signal 195 to an integrated circuit tester external of the integrated circuit 100.

In one embodiment, the comparator 185 determines the frequency of the output clock signal 140 is above the output threshold frequency if the number of clock cycles of the input clock signal 115 counted by the counter 165 in the test interval is equal to the number of clock cycles of the feedback clock signal 145 counted by the counter 170 in the test interval. In another embodiment, the comparator 185 determines the frequency of the output clock signal 140 is above the output threshold frequency if the number of clock cycles of the input clock signal 115 counted by the counter 165 in the test interval and the number of clock cycles of the feedback clock signal 145 counted by the counter 170 in the test interval do not differ by more than a predetermined value. For example, the predetermined value may be one.

In embodiments without the comparator 185, an external device, such as an integrated circuit tester, may read the counter 165 to determine the number of clock cycles of the input clock signal 115 counted by the counter 165 during a test interval. Further, the external device may read the counter 170 to determine the number of clock cycles of the feedback clock signal 145 counted by the counter 170 during the test interval. In these embodiments, the external device determines whether the frequency of the output clock signal 140 is above an output threshold frequency based on the number of clock cycles of the input clock signal 115 and the number of cycles of the feedback clock signal 145 read from the respective counters 165 and 170. For example, the external device may include computing instructions, such as a computer program, for determining whether the output clock signal 140 is above the output threshold frequency based on the number of clock cycles of the input clock signal 115 and the number of cycles of the feedback clock signal 145.

The test circuit 160 may also include an optional controller 180 coupled to each of the counters 165 and 170. The controller 180 receives a control signal 190 for controlling operation of the counters 165 and 170. For example, the controller 180 may receive the control signal 190 from an integrated circuit tester external of the integrated circuit 100. Based on the control signal 190, the controller 180 starts the counters 165 and 170 at a start of a test interval and stops the counters 165 and 170 at an end of the test interval. In this way, the controller 180 determines the test interval based on the control signal 190. In one embodiment, the controller 180 starts the counters 165 and 170 at substantially the same time and stops the counters 165 and 170 at the substantially the same time. In an embodiment without the controller 180, the control signal 190 starts the counters 165 and 170 at substantially the same time. Additionally, the control signal 190 stops the counters 165 and 170 at substantially the same time.

In one embodiment, the frequency of the output clock signal 140 is determined to be above the output threshold frequency if the frequency of the feedback clock signal 145 is determined to be above an input threshold frequency of the input clock signal 115. If the frequency of the feedback clock signal 145 is the same as the frequency of the output clock signal 140, the output threshold frequency is the same as the input threshold frequency of the input clock signal 115. If the frequency of the output clock signal 140 is a multiple N of the frequency of the feedback clock signal 145, the output threshold frequency is a multiple N of the input threshold frequency of the input clock signal 115.

In one embodiment, the input threshold frequency of the input clock signal 115 is below a specified frequency of the input clock signal 115 and is defined by a specified tolerance of the specified frequency. The specified tolerance is a percentage of the specified frequency. Further, the input threshold frequency of the input clock signal 115 is below the specified frequency of the input clock signal 115 by an amount equal to the tolerance (e.g., percentage) of the specified frequency.

In various embodiments, an elevated frequency is selected based on the specified frequency of the input clock signal 115 to be higher than the specified frequency. Additionally, an elevated tolerance is selected based on the specified tolerance to be higher than the specified tolerance. The elevated tolerance defines a threshold frequency of the elevated frequency. The threshold frequency of the elevated frequency is above the input threshold frequency of the input clock signal 115. The test circuit 160 determines whether the frequency of the feedback clock signal 145 is above the threshold frequency of the elevated frequency based on the number of clock cycles counted by the counters 165 and 175 during a test interval. If the frequency of the feedback clock signal 145 is determined to be above the threshold frequency of the elevated frequency, the frequency of the feedback clock signal 145 is determined to be above the input threshold frequency of the input clock signal 115. Moreover, the frequency of the output clock signal 140 is determined to be above the output threshold frequency of the output clock signal 140.

In one embodiment, the elevated tolerance is the reciprocal of the number of clock cycles of the input clock signal 115 counted during a test interval, which depends on the elevated frequency and the test interval. Thus, the elevated tolerance decreases as the number of clock cycles counted during a test interval increases. In another embodiment, the elevated frequency and the test interval are selected such that the counter 165 counts to a value near a maximum count of the counter 165. For example, the counter 165 may include five bits and the elevated frequency and the test interval may be selected such that the counter 165 counts to a value of 30 (e.g., $2^5-2$). Thus, the elevated tolerance is approximately 3 percent (e.g., 1/30). In a further example, the specified frequency may be 100 MHz and the specified tolerance may be 0.001 percent (e.g., 10 ppm). Thus, the input threshold frequency of the input clock signal 115 is 99.999 MHz (e.g., 0.001 percent below the specified frequency of 100 MHz). The elevated frequency may be 105 MHz (e.g., five percent above the specified frequency), and the test interval may be approximately 285.7 ns. Thus, the threshold frequency of the elevated frequency is approximately 101.85 MHz. (e.g., 3 percent below the elevated frequency), which is above the input threshold frequency of 99.999 MHz.

In contrast to the elevated tolerance of 0.03 in this example, the specified tolerance of the input clock signal 115 is 0.00001 (e.g., 0.001 percent). To determine whether the input clock signal 115 is within the specified tolerance at specified frequency, the counter 165 would need to count at least one-hundred-thousand clock cycles, which requires at least 17-bits. Moreover, the test interval required to count one-hundred-thousand clock cycles of the input clock signal 115 at the specified frequency of 100 MHz is 1 ms. Thus, in this example, the test interval (e.g., 1 ms) for determining whether the input clock signal 115 is within the specified tolerance at the specified frequency is more than 3500 times longer than the test interval (e.g., 285.7 ns) for determining whether the frequency of the feedback clock signal 145 is above the input threshold frequency of the input clock signal 115.

Figure 2:
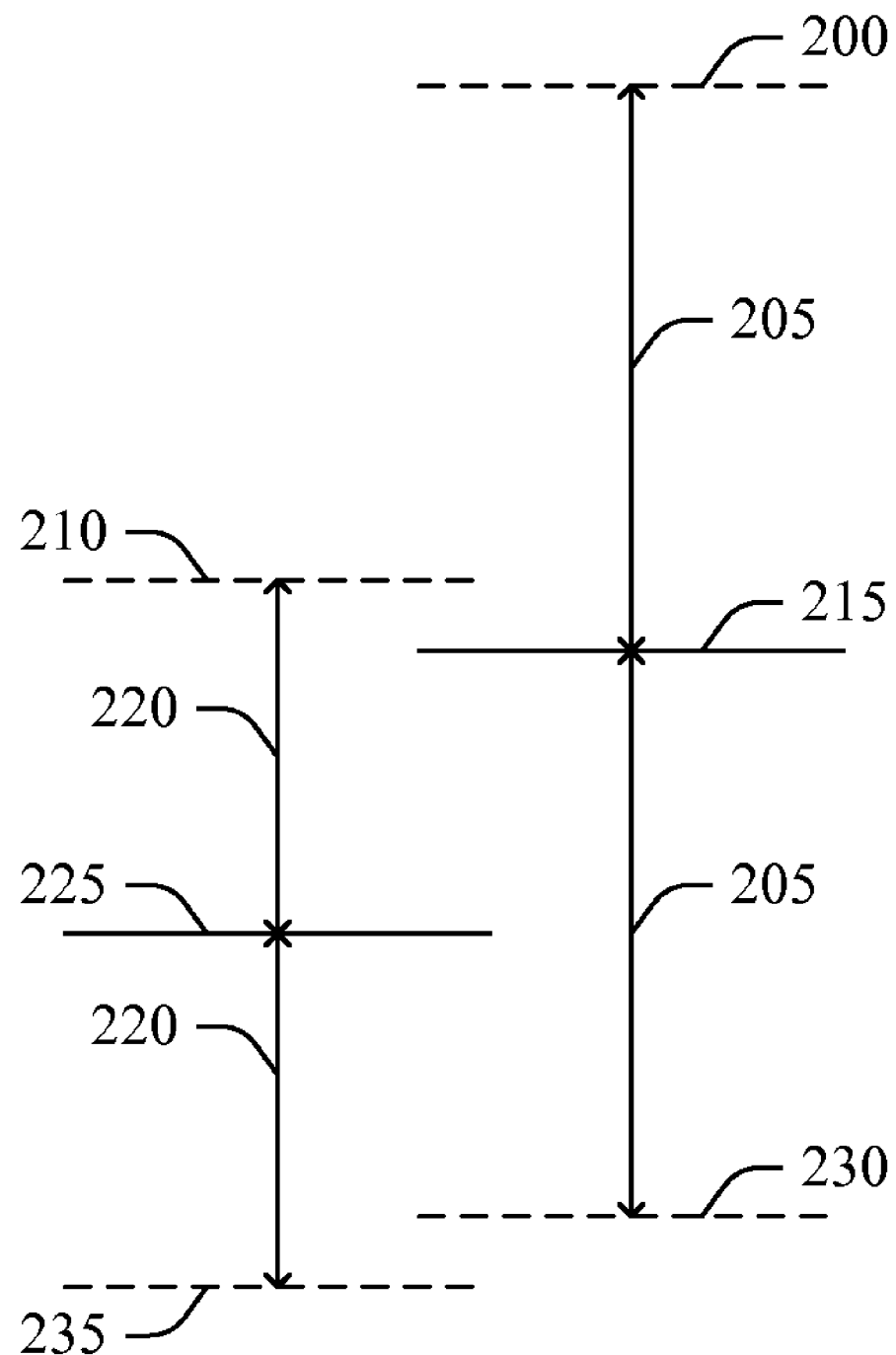
FIG. 2 is diagram of a relationship between a specified frequency and an elevated frequency, in accordance with an embodiment of the present invention.

FIG. 2 illustrates a relationship between a specified frequency 225 and an elevated frequency 215, in accordance with an embodiment of the present invention. As illustrated, the elevated frequency 215 is higher than the specified frequency 225. A specified tolerance 220 of the specified frequency 225 defines an upper threshold frequency 210 and a lower threshold frequency 235 of the specified frequency 225.

In various embodiments, the lower threshold frequency 235 is the input threshold frequency of the input clock signal 115. The specified frequency 225 and the specified tolerance 220 may be specifications for testing the clock circuit 105.

Alternatively, the lower threshold frequency 235 and the upper threshold frequency 210 may be specifications for testing the clock circuit 105. The specified frequency 225 and the specified tolerance 220 may be computed based on the lower threshold frequency 235 and the upper threshold frequency 210. For example, the specified frequency 225 may be computed by determining an average of the lower threshold frequency 235 and the upper threshold frequency 210. The specified tolerance 220 may be computed by subtracting the specified frequency 225 from the upper threshold frequency 210 and dividing the result by the specified frequency 225.

An elevated tolerance 205 of the elevated frequency 215 defines an upper threshold frequency 200 and a lower threshold frequency 230 of the elevated frequency 215. As illustrated, the elevated tolerance 205 is higher than specified tolerance 220. The elevated tolerance 205 is based on the number of clock cycles of the input clock signal 115 counted during a test interval, as is described more fully herein. In various embodiments, the lower threshold frequency 230 is higher than the lower threshold frequency 235 of the specified frequency 225. Moreover, the lower threshold frequency 230 may higher than the specified frequency 225 or higher than the upper threshold frequency 210. In other embodiments, the lower threshold frequency 230 of the elevated frequency 215 may be substantially equal to the lower threshold frequency 235 of the specified frequency 225. In various embodiments, the lower threshold frequency 235 is the threshold frequency of the elevated frequency 215, as is described more fully herein.

Figure 3:
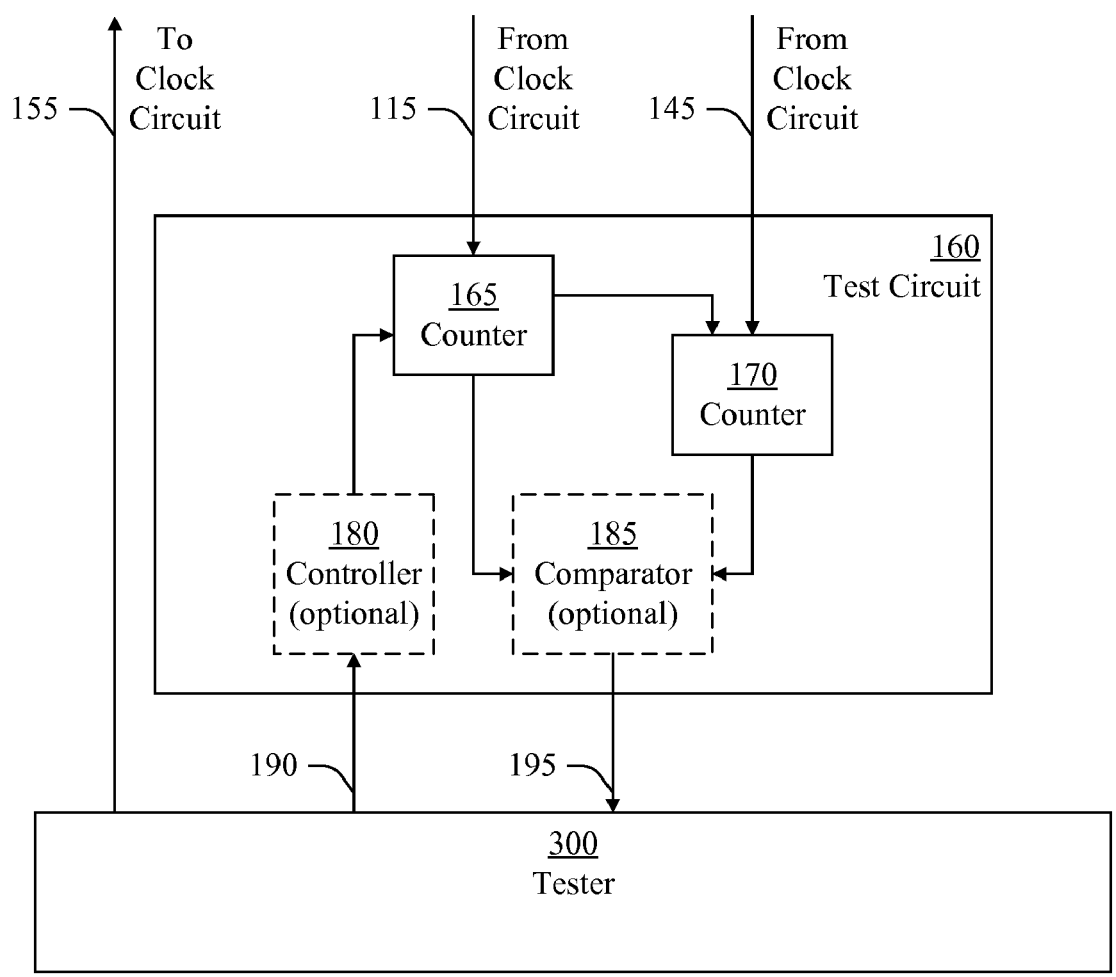
FIG. 3 is block diagram of a test circuit and a tester, in accordance with an embodiment of the present invention.

FIG. 3 illustrates the test circuit 160 and a tester 300, in accordance with an embodiment of the present invention. The tester 300 can be any type of equipment for testing the clock circuit 105. For example, the tester 300 may be an integrated circuit tester. The controller 180 receives the control signal 190 and starts the counter 165 at a start of a test interval based on the control signal 190. Additionally, the controller 180 stops the counter 165 at the end of the test interval based on the control signal 190. The controller 180 may receive the control signal 190 from a device external of the integrated circuit 100, such as the tester 300. In an alternative embodiment, the counter 165 receives the control signal 190. In this embodiment, the control signal 190 starts the counter 165 at the start of the test interval and stops the counter 165 at the end of the test interval. For example, the tester 300 can generate the control signal 190 and provide the control signal 190 to the test circuit 160.

The counter 165 provides a signal to the counter 170 to start the counter 170 at the start of the test interval. Further, the counter 165 provides a signal to the counter 170 to stop the counter 170 at the end of the test interval. For example, the counter 165 may provide a signal to the counter 170 to start the counter 170 when the counter 165 rolls over from its maximum count (e.g., all bits of the counter have a value of one) to a count of zero. Further, the counter 165 may provide a signal to the counter 170 to stop the counter 170 when the counter 165 reaches a selected count, for example one less than its maximum count.

In another embodiment, the counter 170 provides a signal to the counter 165 to start the counter 165 at the start of the test interval. Further, the counter 170 provides a signal to the counter 165 to stop the counter 165 at the end of the test interval. For example, the counter 170 may provide a signal to the counter 165 to start the counter 165 when the counter 170 rolls over from its maximum count (e.g., all bits of the counter have a value of one) to a count of zero. Further, the counter 170 may provide a signal to the counter 165 to stop the counter 165 when the counter 170 reaches a selected count, for example one less than its maximum count. In this embodiment, the controller 180 starts the counter 170 at the start of the test interval and stops the counter 170 at the end of the test interval. In another embodiment, the control signal 190 starts the counter 170 at the start of the test interval and stops the counter 170 at the end of the test interval.

In an alternative embodiment, the tester 300 contains the comparator 185. In this embodiment, the tester 300 reads the values of the counters 165 and 170 and determined based on the values of the counters 165 and 170 whether the frequency of the output clock signal 140 is above the output threshold frequency. Further, the tester 300 starts and stops the counters 165 and 170 by generating the control signal 190. Additionally, the tester 300 generates the control signal 155 for setting the frequency of the input clock signal 115 to the elevated frequency 215.

In a further embodiment, the tester 300 identifies the specified frequency 225 and the specified tolerance 220 of the specified frequency 225, and selects the elevated frequency 215, the elevated tolerance 205, and a test interval for testing the clock circuit 105. The tester 300 may identify the specified frequency 225 and the specified tolerance 220 based on user input to the tester 300. For example, a user may enter the specified frequency 225 and the specified tolerance 220 into the tester 300 by using a computer program in the tester 300 (e.g., a test program).

Figure 4:
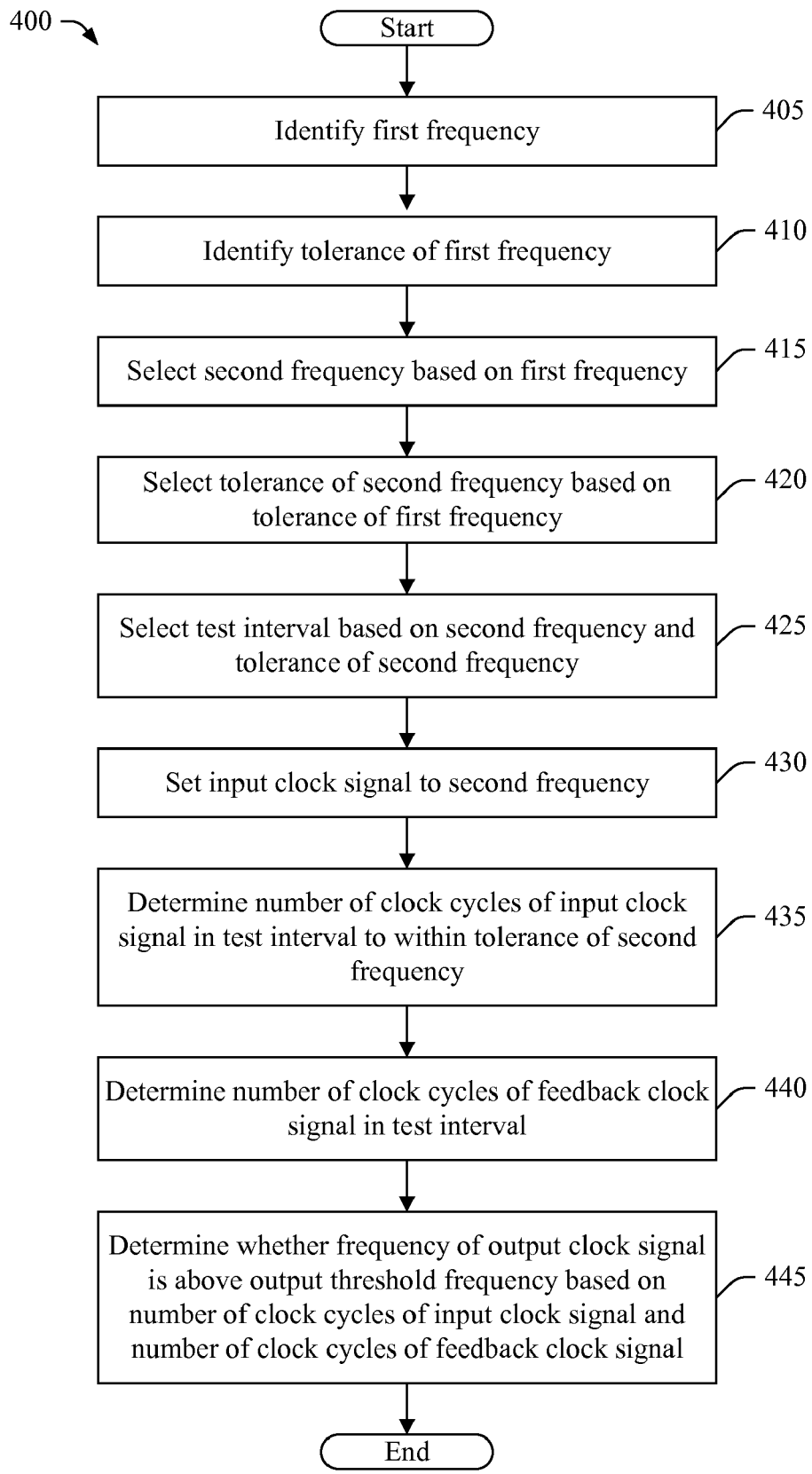
FIG. 4 is a flow chart for a method of testing a clock circuit, in accordance with an embodiment of the present invention.

FIG. 4 illustrates a method of testing the clock circuit 105, in accordance with an embodiment of the present invention. In step 405, a first frequency is identified for the input clock signal 115. The first frequency may be a specified frequency for testing the clock circuit 105, such as the specified frequency 225. In one embodiment, the tester 300 identifies the first frequency based on user input to the tester 300. The method 400 then proceeds to step 410.

In step 410, a tolerance is identified for the first frequency. The tolerance of the first frequency may be a specified tolerance 220 for testing the clock circuit 105. Alternatively, the tolerance of the first frequency may be determined based on a lower threshold frequency 235 and an upper threshold frequency 210 defining a specified frequency range for the input clock signal 115, as is described more fully herein. In one embodiment, the tester 300 identifies the tolerance of the first frequency based on user input to the tester 300. The method 400 then proceeds to step 415.

In step 415, a second frequency is selected based on the first frequency such that the second frequency is higher than the first frequency. For example, the first frequency may be the specified frequency 225 and the second frequency may be the elevated frequency 215. The second frequency may be selected to be a small percentage above the first frequency such as, for example, five percent. In one embodiment, the tester 300 selects the second frequency, for example based on user input. The method 400 then proceeds to step 420.

In step 420, a tolerance is selected for the second frequency based on the tolerance of the first frequency such that the tolerance of the second frequency is higher than the tolerance of the first frequency. In one embodiment, the tolerance of the second frequency is selected to be equal to the reciprocal of a maximum count of the counter 165 less a predetermined value. For example, the predetermined value may be one. In one embodiment, the tester 300 selects the tolerance of the second frequency. The method 400 then proceeds to step 425.

In step 425, a time interval is selected based on the second frequency and the tolerance of the second frequency. The time interval and the second frequency together determine the number of clock cycles of the input clock signal 115 to be counted during the test interval, which is equal to or greater than the reciprocal of the tolerance of the second frequency. In one embodiment, the time interval is selected such that the counter 165 will count a number of clock cycles of the input clock signal 115 that is equal to a maximum count of the counter 165 less a predetermined value. For example, the maximum count of the counter 165 may be thirty-one and the predetermined value may be one. In one embodiment, the tester 300 selects the test interval based on the second frequency and the tolerance of the second frequency. The method 400 then proceeds to step 430.

In step 430, the frequency of the input clock signal 115 is set to the second frequency. In one embodiment, the clock signal generator 110 sets the input clock signal 115 to the second frequency based on the control signal 155. In one embodiment, a device external of the integrated circuit 100, such as the tester 300, provides the control signal 155 to the clock signal generator 110. In another embodiment, a device external of the integrated circuit 100, such as the tester 300, generates the input clock signal 115 having the second frequency and provides the input clock signal 115 to the clock circuit 105. The method 400 then proceeds to step 435.

In step 435, the number of clock cycles of the input clock signal 115 in the test interval is determined to within the tolerance of the second frequency. In one embodiment, the counter 165 counts the number of clock cycles of the input clock signal 115 in the test interval to within the tolerance of the second frequency. In this embodiment, the controller 180 starts the counter 165 at a start of the test interval and stops the counter 165 at the end of the test interval based on the control signal 190. For example, the control signal 190 may be generated by a device external of the integrated circuit 100, such as the tester 300. In another embodiment, the control signal 190 starts and stops the counter 165.

In an alternative embodiment, the counter 170 provides a start signal to the counter 165 to start the counter 165 at the start of the test interval and a stop signal to the counter 165 to stop the counter 165 at the end of the test interval. For example, the counter 170 may provide a start signal to the counter 165 when the counter 170 rolls over from its maximum count (e.g., all bits of the counter have a value of one) to a count of zero. Further, the counter 170 may provide an end signal to the counter 165 when the counter 170 reaches a selected count, for example one less than its maximum count. The method 400 then proceeds to step 440.

In step 440, the number of clock cycles of the feedback clock signal 145 in the test interval is determined. In one embodiment, the counter 170 counts the number of clock cycles of the feedback clock signal 145 in the test interval. In this embodiment, the controller 180 starts the counter 170 at the start of the test interval and stops the counter 165 at the end of the test interval based on the control signal 190.

In an alternative embodiment, the counter 165 provides a start signal to the counter 170 to start the counter 170 at the start of the test interval. Further, the counter 165 provides a stop signal to the counter 170 to stop the counter 170 at the end of the test interval. For example, the counter 165 may provide a start signal to the counter 170 when the counter 165 rolls over from its maximum count (e.g., all bits of the counter have a value of one) to a count of zero. Further, the counter 165 may provide an end signal to the counter 170 when the counter 165 reaches a selected count, for example one less than its maximum count. The method 400 then proceeds to step 445.

In step 445, a determination is made as to whether the frequency of the output clock signal 140 is above an output threshold frequency based on the number of clock cycles of the input clock signal 115 and the number of clock cycles of the feedback clock signal 145 in the time interval. The output threshold frequency is related to the input threshold frequency, as is described more fully herein.

In one embodiment, the comparator 185 of the test circuit 160 compares the number of clock cycles of the input clock signal 115 with the number of clock cycles of the feedback clock signal 145 to determine whether the frequency of the feedback clock signal 145 is above the input threshold frequency. The comparator 185 then determines whether the frequency of the output clock signal 140 is above the output threshold frequency based on a result of the comparison, as is described more fully herein.

In another embodiment, the tester 300 compares the number of clock cycles of the input clock signal 115 with the number of clock cycles of the feedback clock signal 145 to determine whether the frequency of the feedback clock signal 145 is above the input threshold frequency. The tester 300 then determines whether the frequency of the output clock signal 140 is above the output threshold frequency based on a result of the comparison, as is described more fully herein.

In one embodiment, the tester 300 includes the comparator 185. In this embodiment, the comparator 185 may include computing instructions for determining whether the frequency of the feedback clock signal 145 is above the input threshold frequency. For example, the tester 300 may include a computer program including the computing instructions. The method 400 then ends.

Although the invention has been described with reference to particular embodiments thereof, it will be apparent to one of ordinary skill in the art that modifications to the described embodiment may be made without departing from the spirit of the invention. Accordingly, the scope of the invention will be defined by the attached claims not by the above detailed description.

What is claimed is:

1. A method of testing a clock circuit having an output clock signal based on an input clock signal and a feedback clock signal, the method comprising:
   identifying a first frequency for the input clock signal;
   identifying a first tolerance for the first frequency, the first tolerance being a percentage of the first frequency, the first frequency and the first tolerance defining a first threshold frequency for the feedback clock signal and an output threshold frequency for the output clock signal;
   selecting a second frequency, the second frequency being higher than the first frequency;
   selecting a second tolerance for the second frequency, the second tolerance being a percentage of the second frequency, the second tolerance being higher than the first tolerance and defining a second threshold frequency being equal to or higher than the first threshold frequency;
   setting the input clock signal to the second frequency;
   determining a number of clock cycles of the input clock signal in an interval to within the second tolerance of the second frequency by starting a first counter at a start of the interval and stopping the first counter at an end of the interval;
   determining a number of clock cycles of the feedback clock signal in the interval by starting a second counter at the start of the interval and stopping the second counter at the end of the interval; and
   determining whether a frequency of the output clock signal is above the output threshold frequency based on the number of clock cycles of the input clock signal and the number of clock cycles of the feedback clock signal.

2. The method of claim 1, wherein the output threshold frequency is substantially the same as the first threshold frequency.

3. The method of claim 1, wherein determining whether the frequency of the output clock signal is above the output threshold frequency comprises determining whether a frequency of the feedback clock signal is above the first threshold frequency.

4. The method of claim 3, wherein the frequency of the output clock signal is an integer multiple of the frequency of the feedback clock signal, and the output threshold frequency is an integer multiple of the first threshold frequency.

5. The method of claim 1, wherein determining whether the frequency of the output clock signal is above the output threshold frequency comprises determining the number of clock cycles of the input clock signal is equal to the number of clock cycles of the feedback clock signal.

6. The method of claim 1, wherein determining whether the frequency of the output clock signal is above the second threshold frequency comprises determining the number of clock cycles of the input clock signal and the number of clock cycles of the feedback clock signal do not differ by more than a predetermined value.

7. The method of claim 1, wherein starting the second counter at the start of the interval occurs in response to starting the first counter at the start of the interval, and wherein stopping the second counter at the end of the interval occurs in response to stopping the first counter at the end of the interval.

8. The method of claim 1, wherein starting the first counter at the start of the interval and starting the second counter at the start of the interval occur substantially simultaneously, and wherein stopping the first counter at the end of the interval and stopping the second counter at the end of the interval occur substantially simultaneously.

9. The method of claim 1, wherein the clock circuit comprises a phase-locked loop.

10. The method of claim 1, wherein the clock circuit comprises a delay-locked loop.

11. A system for testing a clock circuit having an output clock signal based on an input clock signal and a feedback clock signal, the system comprising:
   a first counter configured to count a number of clock cycles of the input clock signal in an interval to within a second tolerance of a second frequency of the input clock signal by starting a first counter at a start of the interval and stopping the first counter at an end of the interval, the second frequency being above a first frequency, the second tolerance being higher than a first tolerance, the first tolerance being a percentage of the first frequency, the second tolerance being a percentage of the second frequency, the first frequency and the first tolerance defining an output threshold frequency;
   a second counter configured to count a number of clock cycles of the feedback clock signal in the interval by starting a second counter at the start of the interval and stopping the second counter at the end of the interval; and a comparator configured to determine whether a frequency of the output clock signal is above the output threshold frequency based on the number of clock cycles of the input clock signal and the number of clock cycles of the feedback clock signal.

12. The system of claim 11, wherein the comparator is further configured to determine the frequency of the output clock signal is above the output threshold frequency if the number of clock cycles of the input clock signal equals the number of clock cycles of the feedback clock signal.

13. The system of claim 11, wherein the comparator is further configured to determine the frequency of the output clock signal is above the output threshold frequency if the number of clock cycles of the input clock signal and the number of clock cycles of the feedback clock signal do not differ by more than a predetermined value.

14. The system of claim 11, further comprising a controller coupled to the first counter, the controller configured to start the first counter at a start of the interval and to stop the first counter at an end of the interval.

15. The system of claim 14, wherein the controller is further coupled to the second counter, the controller further configured to start the second counter at the start of the interval and to stop the second counter at the end of the interval.

16. The system of claim 14, wherein the first counter is coupled to the second counter and is further configured to start the second counter at the start of the interval and to stop the second counter at the end of the interval.

17. A system for testing a clock circuit having an output clock signal based on an input clock signal and a feedback clock signal, the system comprising:
 means for counting a number of clock cycles of the input clock signal in an interval to within a second tolerance of a second frequency of the input clock signal by starting a first counter at a start of the interval and stopping the first counter at an end of the interval, the second frequency being above a first frequency, the second tolerance being higher than a first tolerance, the first tolerance being a percentage of the first frequency, the second tolerance being a percentage of the second frequency, the first frequency and the first tolerance defining an output threshold frequency;
 means for counting a number of clock cycles of the feedback clock signal in the interval by starting a second counter at the start of the interval and stopping the second counter at the end of the interval; and
 means for determining whether a frequency of the output clock signal is above the output threshold frequency based on the number of clock cycles of the input clock signal and the number of clock cycles of the feedback clock signal.

18. The system of claim 17, further comprising means for selecting the second frequency.

19. The system of claim 18, further comprising means for selecting the second tolerance.

* * * * *